(12) United States Patent  (10) Patent No.: US 7,675,772 B2
Goda et al.  (45) Date of Patent: Mar. 9, 2010

(54) MULTILEVEL MEMORY CELL OPERATION

(75) Inventors: Akira Goda, Boise, ID (US); Seiichi Aritome, Zhudong (TW)

(73) Assignee: Micron Technology, Inc., Boise, ID (US)

( * ) Notice: Subject to any disclaimer, the term of this patent is extended or adjusted under 35 U.S.C. 154(b) by 191 days.

(21) Appl. No.: 11/924,793

(22) Filed: Oct. 26, 2007

(65) Prior Publication Data

US 2009/0109743 A1    Apr. 30, 2009

(51) Int. Cl.
*G11C 11/34*    (2006.01)
(52) U.S. Cl. ............................ 365/185.03; 365/185.2; 365/210
(58) Field of Classification Search ............ 365/185.03, 365/185.2, 210, 185.28, 185.21, 185.05, 365/185.18, 185.22, 185.24, 189.01, 189.09, 365/189.07
See application file for complete search history.

(56) References Cited

U.S. PATENT DOCUMENTS

| | | | |
|---|---|---|---|
| 6,969,883 B2 | 11/2005 | Chindalore et al. | |
| 7,038,946 B2 | 5/2006 | Hosono et al. | |
| 7,184,313 B2* | 2/2007 | Betser et al. | 365/185.24 |
| 7,187,585 B2 | 3/2007 | Li et al. | |
| 7,196,946 B2 | 3/2007 | Chen et al. | |
| 7,257,025 B2 | 8/2007 | Maayan et al. | |
| 7,257,032 B2 | 8/2007 | Fujiu et al. | |
| 7,529,130 B2* | 5/2009 | Toda | 365/185.12 |
| 2006/0239073 A1* | 10/2006 | Toda | 365/185.03 |
| 2007/0002632 A1* | 1/2007 | Okayama et al. | 365/185.24 |

OTHER PUBLICATIONS

Eitan, Boaz et al. "4-bit per Cell NROM Reliability". IEEE, 2005, pp. 1-4.

* cited by examiner

*Primary Examiner*—Dang T Nguyen
(74) *Attorney, Agent, or Firm*—Brooks, Cameron & Huebsch, PLLC

(57) ABSTRACT

One or more embodiments of the present disclosure provide methods, devices, and systems for operating non-volatile multilevel memory cells. One method embodiment includes programming a memory cell to one of a number of different threshold voltage (Vt) levels, each level corresponding to a program state. The method includes programming a reference cell to a Vt level at least as great as an uppermost Vt level of the number of different Vt levels, performing a read operation on the reference cell, and determining a number of read reference voltages used to determine a particular program state of the memory cell based on the read operation performed on the reference cell.

22 Claims, 9 Drawing Sheets

| PROGRAMMING | | |
|---|---|---|
| | DATA CELLS | REFERENCE CELLS |
| Vpgm_start | 15V - 16V | 19V - 20V |
| Vpgm_step | 0.2V - 0.5V | 0.8V - 1.0V |
| Vpgm_verify | Vv1, Vv2, Vv3 | Vvref ≥ Vv3 |

| REFERENCE CELLS FAILED COUNT | INITIAL READ REFERENCE VOLTAGES (R1, R2, R3) | | |
|---|---|---|---|
| < X1 | R1 | R2 | R3 |
| X1 --> X2 | R1 | R2-X | R3-Y |
| > X2 | R1 | R2-XX | R3-YY |

| BL CURRENT | INITIAL READ REFERENCE VOLTAGES | | |
|---|---|---|---|
| | (R1, | R2, | R3) |
| < Y1 | R1 | R2 | R3 |
| Y1 --> Y2 | R1 | R2-Z | R3-Z |
| > Y2 | R1 | R2-ZZ | R3-ZZ |
*Fig. 6C*
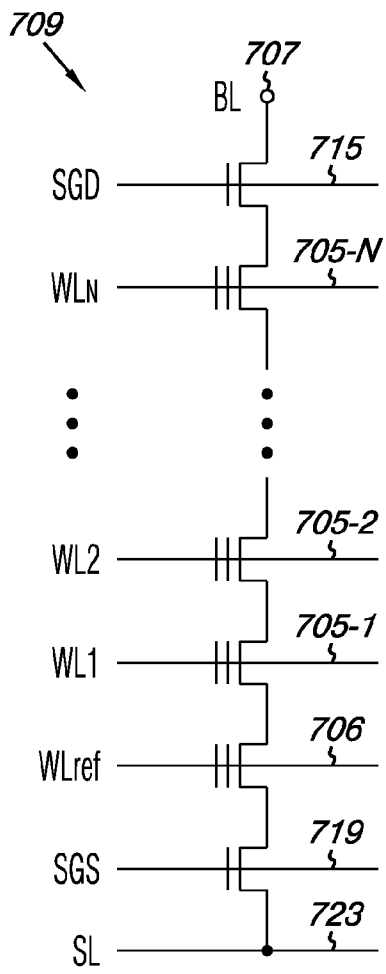
*Fig. 7*
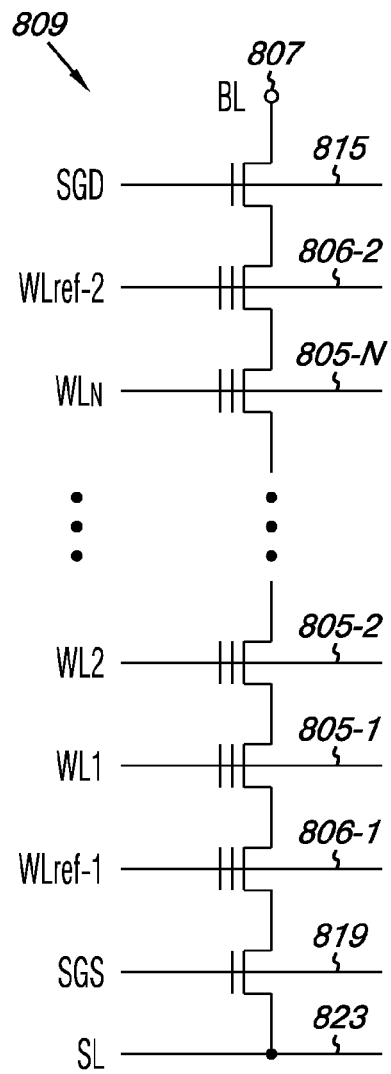
*Fig. 8*

PROGRAMMING

910 — PROGRAMMING A NUMBER OF DATA MEMORY CELLS COUPLED TO A SELECTED ROW SELECT LINE TO ONE OF A NUMBER OF DIFFERENT THRESHOLD VOLTAGE (VT) LEVELS, EACH DIFFERENT VT LEVEL CORRESPONDING TO A DIFFERENT PROGRAM STATE;

920 — PROGRAMMING A NUMBER OF REFERENCE CELLS TO A PARTICULAR VT LEVEL

*Fig. 9A*

READING

930 — SELECT BLOCK

940 — PERFORMING A READ OPERATION ON THE NUMBER OF REFERENCE CELLS IN THE SELECTED BLOCK

950 — DETERMINING A NUMBER OF READ REFERENCE VOLTAGES TO BE USED TO DETERMINE THE PARTICULAR PROGRAM STATES OF THE DATA MEMORY CELLS IN THE SELECTED BLOCK BASED ON THE READ OPERATION PERFORMED ON THE REFERENCE CELLS IN THE SELECTED BLOCK

960 — PERFORMING A READ OPERATION ON THE DATA MEMORY CELLS IN THE SELECTED BLOCK USING THE DETERMINED READ REFERENCE VOLTAGES

*Fig. 9B*

MULTILEVEL MEMORY CELL OPERATION

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory, among others.

Flash memory devices are utilized as non-volatile memory for a wide range of electronic applications. Flash memory devices typically use a one-transistor memory cell that allows for high memory densities, high reliability, and low power consumption.

Uses for flash memory include memory for personal computers, personal digital assistants (PDAs), digital cameras, and cellular telephones. Program code and system data, such as a basic input/output system (BIOS), are typically stored in flash memory devices. This information can be used in personal computer systems, among others.

Two common types of flash memory array architectures are the "NAND" and "NOR" architectures, so called for the logical form in which the basic memory cell configuration of each is arranged. In the NOR array architecture, the floating gate memory cells of the memory array are typically arranged in a matrix.

The gates of each floating gate memory cell of the array matrix are typically coupled by rows to row select lines and their drains are coupled to column sense lines. The NOR architecture floating gate memory array is accessed by a row decoder activating a row of floating gate memory cells by selecting the row select line coupled to their gates. The row of selected memory cells then place their data values on the column sense lines by flowing different currents depending on if a particular cell is in a programmed state or an erased state.

A NAND array architecture arranges its array of floating gate memory cells in a matrix such that the gates of each floating gate memory cell of the array are coupled by rows to row select lines. However, each memory cell is not directly coupled to a column sense line by its drain. Instead, the memory cells of the array are coupled together in series, source to drain, between a source line and a column sense line.

Memory cells in a NAND array architecture can be programmed to a desired state. That is, electric charge can be placed on, or removed from, the floating gate of a memory cell to put the cell into a number of stored states. For example, a single level cell (SLC) can represent two binary states, e.g., 1 or 0. Flash memory cells can also store more than two binary states, e.g., 1111, 0111, 0011, 1011, 1001, 0001, 0101, 1101, 1100, 0100, 0000, 1000, 1010, 0010, 0110, and 1110. Such cells may be referred to as multi state memory cells, multibit cells, or multilevel cells (MLCs). MLCs can allow the manufacture of higher density memories without increasing the number of memory cells since each cell can store more than one digit, e.g., more than one binary bit. MLCs can have more than one programmed state. For instance, a cell capable of storing four bits can have sixteen different program states.

As MLCs undergo programming and erase cycling over time, data retention can become an issue. For instance, the stored charge on the floating gate of a MLC can change over time, which may result in an erroneous read of the memory cell. That is, the determined state of the cell during a read operation performed on the cell may be a state other than the state to which the cell was programmed. In some cases, the time period between when a cell is programmed and when the cell is read can be substantial. For instance, a time period of days, months, or years may pass before a programmed cell is read. In such cases, the stored charge on the floating gate of the cell may decrease, e.g., leak, leading to reduced data retention. The data retention reduction can be more significant for cells which have experienced greater program and erase cycling.

BRIEF DESCRIPTION OF THE DRAWINGS

FIG. 6C illustrates a table showing read reference voltages used to determine the particular state of a data memory cell based on a read operation performed on a reference memory cell in accordance with an embodiment of the present disclosure.

FIG. 7 illustrates a schematic of a portion of a non-volatile memory array in accordance with an embodiment of the present disclosure.

FIG. 8 illustrates a schematic of a portion of a non-volatile memory array in accordance with an embodiment of the present disclosure.

FIGS. 9A and 9B illustrate flow diagrams for operating an array of memory cells according to an embodiment of the present disclosure.

DETAILED DESCRIPTION

One or more embodiments of the present disclosure provide methods, devices, and systems for operating non-volatile multilevel memory cells. One method embodiment includes programming a memory cell to one of a number of different threshold voltage (Vt) levels, each level corresponding to a program state. The method includes programming a reference cell to a Vt level at least as great as an uppermost Vt level of the number of different Vt levels, performing a read operation on the reference cell, and determining a number of read reference voltages used to determine a particular program state of the memory cell based on the read operation performed on the reference cell.

In one or more embodiments, determining the number of read reference voltages can include adjusting at least one read reference voltage of an initial set of predetermined read reference voltages from an initial voltage level. As such, one or more of the initial set of read reference voltages used to determine the particular state of one or more data cells can be based on a read operation performed on one or more reference cells.

In the following detailed description of the present disclosure, reference is made to the accompanying drawings that form a part hereof, and in which is shown by way of illustration how various embodiments of the disclosure may be practiced. These embodiments are described in sufficient detail to enable those of ordinary skill in the art to practice the embodiments of this disclosure, and it is to be understood that other embodiments may be utilized and that process, electrical, or mechanical changes may be made without departing from the scope of the present disclosure.

Figure 1:
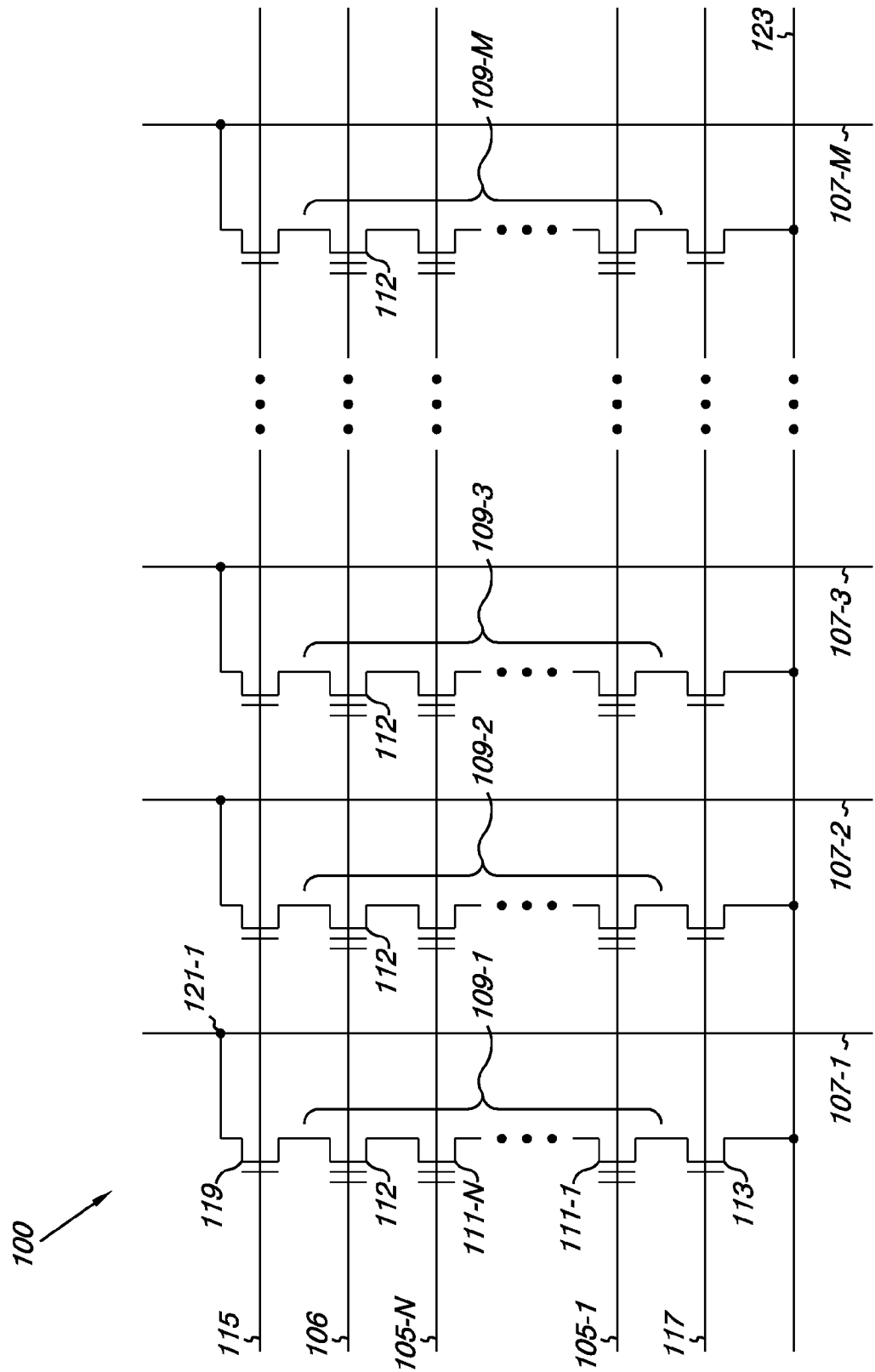
FIG. 1 is a schematic of a portion of a non-volatile memory array in accordance with an embodiment of the present disclosure.

FIG. 1 is a schematic of a portion of a non-volatile memory array 100 in accordance with an embodiment of the present disclosure. The embodiment of FIG. 1 illustrates a NAND architecture non-volatile memory. However, embodiments described herein are not limited to this example.

As shown in FIG. 1, the memory array 100 includes row select lines 105-1, ..., 105-N and 106 and intersecting column sense lines 107-1, ..., 107-M. As one of ordinary skill in the art will appreciate, row select lines 105-1, ..., 105-N and 106 can be referred to as word lines, and column sense lines 107-1, ..., 107-M can be referred to as bit lines. The row select lines 105-1, ..., 105-N and 106 may be referred to herein as "select lines" and the column sense lines 107-1, ..., 107-M may be referred to herein as "sense lines."

In the embodiment illustrated in FIG. 1, the row select lines 105-1, ..., 105-N are coupled to respective data memory cells 111-1, ..., 111-N, e.g., memory cells used to store user data, while the row select line 106 is coupled to reference memory cells 112, e.g., memory cells not used to store user data. For ease of addressing in the digital environment, the number of select lines 105-1, ..., 105-N and the number of sense lines 107-1, ..., 107-M can each be some power of two, e.g., 32 select lines by 4,096 sense lines. One of ordinary skill in the art will appreciate that the sense lines 107-1, ..., 107-M can be coupled to sensing circuitry (not shown in FIG. 1) which can be used to determine the Vt level and/or state of a selected memory cell based on sensed current and/or voltage levels.

Memory array 100 includes NAND strings 109-1, ..., 109-M. In the embodiment shown in FIG. 1, each NAND string includes non-volatile memory cells 111-1, ..., 111-N, each located at an intersection of a select line 105-1, ..., 105-N and a local sense line 107-1, ..., 107-M. In the embodiment illustrated in FIG. 1, the strings 109-1, ..., 109-M each also include a non-volatile reference memory cell 112. The non-volatile memory cells 111-1, ..., 111-N and 112 of each NAND string 109-1, ..., 109-M are connected in series source to drain between a source select gate (SGS) 113, e.g., a field-effect transistor (FET) 113, and a drain select gate (SGD) 119, e.g., FET 119. Source select gate 113 is located at the intersection of a local sense line 107-1 and a source select line 117 while drain select gate 119 is located at the intersection of a local sense line 107-1 and a drain select line 115.

In various embodiments, and as shown in FIG. 1, the reference memory cell 112 of the strings 109-1, ..., 109-M are located at the drain end of the strings. That is, the reference memory cells 112 are adjacent to drain select gates 119. Placing the reference memory cells 112 at the drain end of the strings 109-1, ..., 109-M can have various benefits. For example, in some embodiments, the array 100 can be programmed on a row by row basis starting from the row select line 105-1 adjacent to the source select line 117. In such embodiments, the row select line adjacent to the drain select line 115, e.g., reference row line 106 in this embodiment, is programmed last. As such, the reference cells 112 coupled to reference row select line 106 can experience less program disturb than that experienced by the data cells coupled to the previously programmed data row select lines 105-1, ..., 105-N.

In some prior approaches in which data cells are placed at the ends of strings, e.g., adjacent the drain select gate 119 or source select gate 113 of strings 109-1, ..., 109-M shown in FIG. 1, those data cells can experience greater Vt fluctuations due to biasing conditions during operation than data cells located further away from the string edges. Therefore, placing the reference memory cells 112 at the drain end and/or source end of the strings 109-1, ..., 109-M can result in a reduction in Vt level fluctuations experienced by data memory cells which would have been placed at the end of the strings in prior approaches.

As shown in the embodiment illustrated in FIG. 1, a source of source select gate 113 is connected to a common source line 123. The drain of source select gate 113 is connected to the source of the memory cell 111-1 of the corresponding NAND string 109-1. The drain of drain select gate 119 is connected to the local sense line 107-1 for the corresponding NAND string 109-1 at drain contact 121-1. The source of drain select gate 119 is connected to the drain of the last memory cell, e.g., reference memory cell 112 in this embodiment, of the corresponding NAND string 109-1.

In various embodiments, construction of non-volatile memory cells, 111-1, ..., 111-N and 112, includes a source, a drain, a floating gate or other charge storage layer, and a control gate. That is, in various embodiments, the reference cells are physically the same as the data cells, e.g., they both are floating gate memory cells. Non-volatile memory cells, 111-1, ..., 111-N, e.g., data cells, have their control gates coupled to a select line, 105-1, ..., 105-N, respectively. Non-volatile memory cells 112 have their control gates coupled to select line 106. A column of the non-volatile memory cells 111-1, ..., 111-N and 112 make up the NAND strings, e.g., 109-1, ..., 109-M, coupled to a given local sense line, e.g., 107-1, ..., 107-M respectively. A row of the non-volatile memory cells are commonly coupled to a given row select line, e.g., 105-1, ..., 105-N and 106.

The array 100 shown in FIG. 1 can represent a block 100 of memory cells. A block of memory cells can refer to a number of memory cells, e.g., data cells and reference cells, which are erased together as a group. As one of ordinary skill in the art will appreciate, a memory array, e.g., array 1030 shown in FIG. 10, can include a number of blocks of memory cells, e.g., block 100 shown in FIG. 1. Embodiments of the present disclosure are not limited to a particular number of physical rows 105-1, . . . , 105-N of data memory cells 111-1, . . . , 111-N or to a particular number of physical rows 106 of reference memory cells 112.

As described further below in connection with FIGS. 2A, 2B, 3A, 3B, and 4, in one or more embodiments of the present disclosure, the data memory cells, e.g., 111-1, . . . , 111-N, can be programmed and/or read differently than the reference memory cells, e.g., 112. For instance, in one or more embodiments, the reference memory cells 112 are programmed to a particular Vt level which is at least as great as an uppermost Vt level of a number of Vt levels to which the data memory cells 111-1, . . . , 111-N can be programmed. In such embodiments, the data memory cells 111-1, . . . , 111-N can be programmed prior to programming of the reference cells 112, and the data cells 111-1, . . . , 111-N can be read after the reference cells 112 are read. In one or more embodiments, the read reference voltages used to determine the particular state to which the data cells 111-1, . . . , 111-N are programmed can be adjusted based on the read operation performed on the reference cells 112.

Figures 2A, 2B:
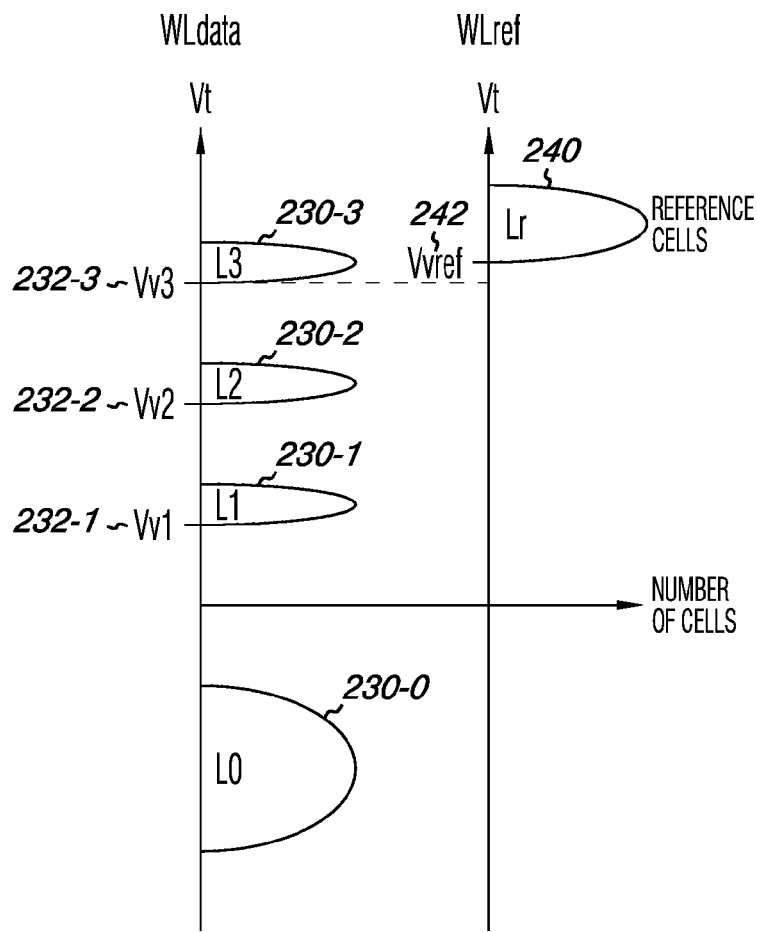
FIG. 2A illustrates a number of threshold voltage (Vt) distributions associated with data memory cells and reference memory cells programmed in accordance with an embodiment of the present disclosure.
FIG. 2B illustrates example voltages associated with programming data memory cells and reference memory cells in accordance with the embodiment shown in FIG. 2A.

FIG. 2A illustrates a number of threshold voltage (Vt) distributions associated with data memory cells, e.g., data cells 111-1, . . . , 111-N shown in FIG. 1, and reference memory cells, e.g., reference cells 112 shown in FIG. 1, programmed in accordance with an embodiment of the present disclosure. In the embodiment shown in FIG. 2A, the Vt distributions 230-0, 230-1, 230-2, and 230-3 represent data cells programmed to one of the four program states L0, L1, L2, and L3, respectively. However, embodiments of the present disclosure are not limited to data memory cells programmed to a particular number of states, e.g., the data memory cells may be programmed to more or fewer than four program states. As the reader will appreciate, the program states L0, L1, L2, and L3, can represent a number of stored data digits. For instance, state L0 can represent binary data "11" stored by a data cell, state L1 can represent binary data "01" stored by a cell, state L2 can represent binary data "00" stored by a cell, and state L3 can represent binary data "10" stored by a cell. In the embodiment shown in FIG. 2A, the Vt distribution 240 represents reference cells programmed to program state Lr.

In one or more embodiments, a series of programming voltage pulses can be applied to the control gate of a memory cell in order to program the cell by increasing the Vt level of the cell to a desired level. In the embodiment shown in FIG. 2A, during a programming operation, the Vt level of data cells to be programmed to program state L1 is increased until the Vt level reaches verify voltage level 232-1 (Vv1). The Vt level of data cells to be programmed to program state L2 is increased until the Vt level reaches verify voltage level 232-2 (Vv2). The Vt level of data cells to be programmed to program state L3 is increased until the Vt level reaches verify voltage level 232-3 (Vv3). In the embodiment shown in FIG. 2A, during a programming operation, the Vt level of reference cells to be programmed to program state Lr is increased until the Vt level reaches verify voltage level 242 (Vvref).

In one or more embodiments, a programming operation includes programming a reference cell to a Vt level, e.g., Vvref 242, which is at least as great as an uppermost Vt level, e.g., Vv3 232-3, of the number of different Vt levels, e.g., Vv1 232-1, Vv2 232-2, and Vv3 232-3, to which the data cells can be programmed. In the embodiment illustrated in FIG. 2A, the Vt level Vvref 242 is greater than the uppermost Vt level Vv3 232-3. That is, the magnitude of Vvref 242 is greater, i.e., higher, than the magnitude of Vv3 232-3. Programming reference memory cells to a Vt level at least as great as the uppermost Vt level to which the data memory cells are programmed can provide various benefits. For instance, the higher Vt associated with programmed reference cells can make the reference cells more sensitive to Vt shifts over time than data cells programmed to lower Vt levels. In such cases, a Vt shift associated with programmed reference cells can be greater than a Vt shift associated with programmed data cells over a given time period. As such, and as described further herein below, the Vt shift associated with one or more reference cells can be used as a reference in determining adjusted read reference voltages associated with determining particular program states for programmed data cells.

In embodiments in which a series of programming pulses are used to program the data cells and reference cells, the programming pulses can be incrementally increased until the Vt of a selected cell reaches the desired program verify voltage level, e.g., program verify voltage levels Vv1 232-1, Vv2 232-2, Vv3 232-3 for data cells and program verify voltage level Vvref 242 for reference cells.

FIG. 2B illustrates example voltages associated with programming data memory cells and reference memory cells in accordance with the embodiment shown in FIG. 2A. In various embodiments of the present disclosure, the magnitude of the initial programming pulse, e.g., Vpgm_start, applied to the control gates of data cells is different than the magnitude of the initial programming pulse applied to the control gates of reference cells. Also, in various embodiments, the voltage step, e.g., Vpgm_step, between programming pulses is different for data cells and reference cells.

As shown in table 201 of FIG. 2B, in one or more embodiments, the initial programming pulse (Vpgm_start) associated with programming data cells can be about 15V-16V, while the initial programming pulse associated with programming reference cells can be about 19V-20V. In various embodiments, the step voltage (Vpgm_step) can be smaller for data cells than for reference cells. For example, as illustrated in the embodiment shown in table 201, the step voltage between programming pulses can be about 0.2V-0.5V for data cells and about 0.8V-1.0V for reference cells.

In such embodiments, the programming pulses associated with programming data cells can be incremented in 0.2V-0.5V steps from the initial programming pulse magnitude of about 15V-16V to about 20V, while the programming pulses associated with programming reference cells can be incremented in 0.8V-1.0V increments from the initial programming pulse magnitude of about 19V-20V to about 24V. Using a higher initial programming pulse to program reference cells and/or using a higher step voltage between pulses to program reference cells can provide various benefits such as decreasing the programming time associated with programming reference cells, among other benefits.

As shown in table 201, in one or more embodiments, the program verify voltage (Vpgm_verify) level Vvref to which the reference cells are programmed is at least as great as the uppermost program verify voltage level Vv3 to which the data cells can be programmed. Embodiments of the present disclosure are not limited to the example voltages shown in FIGS. 2A and 2B.

In various embodiments, the lowermost Vt distribution 230-0 can represent cells having a negative Vt level and may be referred to as an erase state. As one of ordinary skill in the art will appreciate, multilevel memory cells may be erased, e.g., the Vt level can be brought to a negative voltage, prior to being programmed to a desired program state. That is, MLCs can be programmed from an erase state to one of a number of different program states, e.g., program states L0, L1, L2, and L3 shown in FIG. 2A.

Figure 3A:
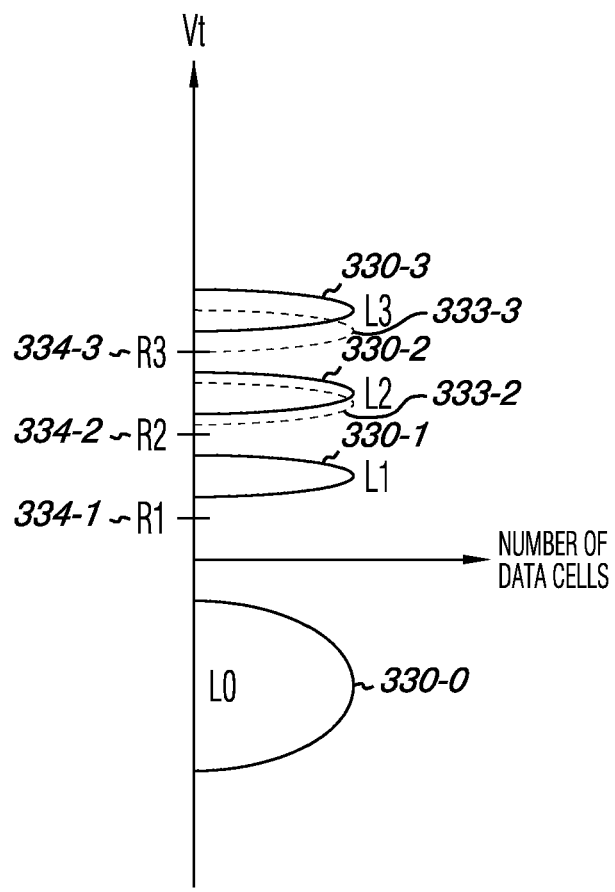
FIG. 3A illustrates a number of Vt distributions and read reference voltages associated with data memory cells programmed in accordance with an embodiment of the present disclosure.
Figure 3B:
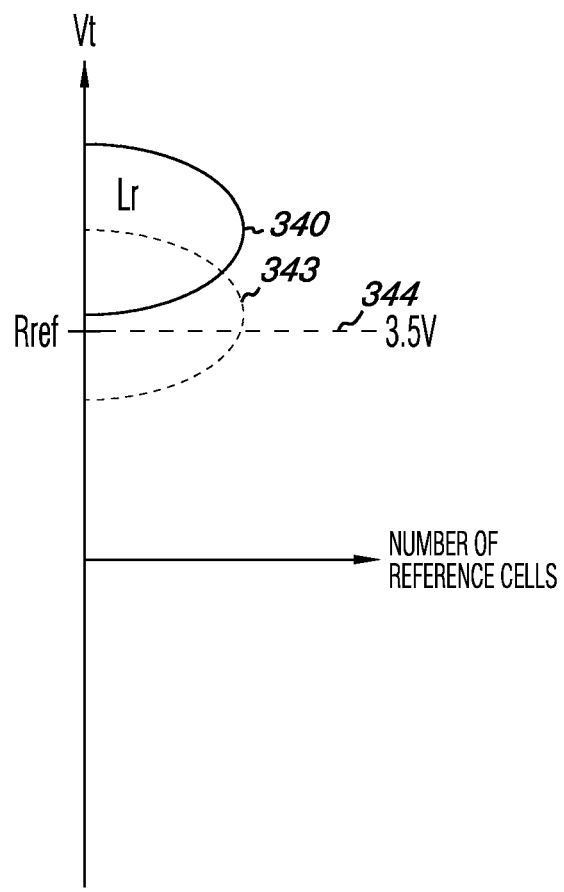
FIG. 3B illustrates Vt distributions and a read reference voltage associated with reference memory cells programmed in accordance with an embodiment of the present disclosure.

FIG. 3A illustrates a number of Vt distributions and read reference voltages associated with data memory cells, e.g., data cells 111-1, ..., 111-N shown in FIG. 1, programmed in accordance with an embodiment of the present disclosure. FIG. 3B illustrates Vt distributions and a read reference voltage associated with reference memory cells, e.g., reference cells 112 shown in FIG. 1, programmed in accordance with an embodiment of the present disclosure.

In the embodiment shown in FIG. 3A, the Vt distributions 330-0, 330-1, 330-2, and 330-3 represent data cells programmed to the program states L0, L1, L2, and L3, respectively. That is, data cells programmed to program state L0 are programmed such that the Vt level of the data cell is within distribution 330-0, the data cells programmed to program state L1 are programmed such that the Vt level of the data cell is within distribution 330-1, the data cells programmed to program state L2 are programmed such that the Vt level of the data cell is within distribution 330-2, and the data cells programmed to program state L3 are programmed such that the Vt level of the data cell is within distribution 330-3. The embodiment shown in FIG. 3B illustrates a Vt distribution 340 corresponding to reference cells programmed such that the Vt of the reference cells is at a Vt level within distribution 340.

FIG. 3A also illustrates a number of read reference voltages R1, R2, and R3 used to determine into which of the four program states L0, L1, L2, and L3, a data cell has been programmed. The read reference voltages R1, R2, and R3 represent an initial set of read reference voltage levels used in read operations performed on the data cells. The initial set of read reference voltages R1, R2, and R3 can be predetermined voltage levels. As one example, R1 can be about 0-0.5V, R2 can be about 1.5-2.0V, and R3 can be about 2.75-3.25V. In one or more embodiments, at least one of the number of initial read reference voltages, e.g., R1, R2, and R3, used to determine a particular program state, e.g., L0, L1, L2, and L3, of the number of memory cells is adjusted based on a read operation performed on one or more reference cells. As described below in connection with FIGS. 5A through 6C, the voltage amount by which the initial read reference voltages, e.g., R1, R2, and R3, are adjusted, can depend on various factors such as a sensed cumulative amount of sense line current associated with the one or more reference cells or such as the number of the one or more reference cells which are determined to have failed a read operation, among other factors.

To determine the state of a selected data cell, a read reference voltage, e.g., R1, R2, or R3, is applied to a selected row select line, e.g., the row select line to which the control gate of the selected data cell is coupled. As described further below, the unselected row select lines, e.g., the row select lines to which the control gates of the other data cells coupled to the same sense line as the selected data cell, are biased at a "pass through" voltage, e.g., a voltage that places the unselected data cells in a conducting state in which the unselected data cells pass current independent of their programmed Vt level. In embodiments in which the sense line to which the selected data cell is coupled includes one or more reference cells, the reference cells are also biased at a pass through voltage during a read operation performed on the selected data cell. As described further in connection with FIGS. 4, 5A, and 5B, in such embodiments, the pass through voltage applied to an unselected reference cell can be greater than the pass through voltage applied to an unselected data cell during the read of the selected data cell.

Sensing circuitry coupled to the sense line to which the selected data cell is coupled can then be used to determine whether or not the selected data cell conducts current in response to the applied read reference voltage. The determination by the sensing circuitry of whether the cell conducts current in response to a particular read reference voltage, e.g., R1, R2, and R3, can be based on a comparison of reference current and/or voltage levels to current and/or voltage levels measured on the sense line.

Whether or not the selected data cell conducts current depends on the Vt of the selected cell. For instance, if R2 is applied to the selected row select line and the Vt of the selected data cell is less than R2, then the selected data cell will conduct current indicating that the selected data cell has a Vt less than R2, e.g., the sensing circuitry determines the cell to be in state L1 or L0. If R2 is applied to the selected row select line and the Vt of the selected data cell is greater than R2, then the selected data cell will not conduct current indicating that the selected data cell has a Vt greater than R2, e.g., the sensing circuitry determines the cell to be in state L2 or L3. To further determine the state of the selected cell, a different read reference voltage, e.g., R1 or R3, can be used to distinguish between whether the selected cell is in one of states L0 or L1 or whether the selected cell is within one of states L2 or L3.

The embodiment shown in FIG. 3B also illustrates a read reference voltage Rref 344 used to perform a read operation on a reference cell programmed to state Lr 340. The read reference voltage Rref can be a predetermined voltage level, e.g., 3.5V in this example. To read a selected reference cell, e.g., reference cell 112 shown in FIG. 1, programmed to state Lr, the read reference voltage Rref is applied to a selected row select line, e.g., row select line 106 shown in FIG. 1. As described further below, unselected row select lines, e.g., row select lines 105-1 to 105-N shown in FIG. 1, can be biased at a pass through voltage such that those cells are in an "ON" state in which they pass current independent of the programmed Vt level of the cells. Sensing circuitry coupled to the sense line to which the selected reference cell is coupled can then be used to determine whether or not the selected reference cell conducts current in response to the applied read reference voltage Rref. The determination by the sensing circuitry of whether the selected reference cell conducts current in response to the applied read reference voltage Rref can be based on a comparison of reference current and/or voltage levels to current and/or voltage levels measured on the sense line to which the selected reference cell is coupled.

Whether or not the selected reference cell conducts current depends on the Vt of the selected reference cell and determines whether the selected reference cell passes or fails the read operation. For instance, if Rref is applied to the selected row select line and the Vt of the selected reference cell is less than Rref, e.g., due to charge leakage and/or electron detrapping, then the selected reference cell will conduct current indicating that the selected reference cell has failed the read operation, e.g., the sensing circuitry determines the reference cell to not be in the state Lr 340 to which the selected reference cell was programmed. If Rref is applied to the selected row select line and the Vt of the selected reference cell is greater than Rref, then the selected reference cell will not conduct current indicating that the selected reference cell has passed the read operation, e.g., the sensing circuitry determines the reference cell to be in state Lr 340 to which the selected reference cell was programmed. The number of reference cells which conduct current, e.g., fail the read operation, when Rref is used as the read reference voltage, increases as the Vt level shift of reference cells programmed to state Lr 340 increases.

In the embodiment shown in FIG. 3A, the Vt distributions 333-2 and 333-3 represent a Vt level shift corresponding to data cells initially programmed to states L2 and L3, i.e., Vt distributions 330-2 and 330-3, respectively. In the embodiment shown in FIG. 3B the Vt distribution 343 represents a Vt level shift corresponding to reference cells initially programmed to state Lr, i.e., Vt distribution 340. The downward Vt level shifts indicated by Vt distributions 333-2, 333-3, and 343 illustrates an example of Vt level shifts that can be experienced by programmed cells over a particular time period, which can be hours, days, months, or years, in which a programmed cell can experience varying environmental conditions, e.g., varying temperature and/or humidity conditions, among other varying conditions prior to being read. The downward Vt shifts associated with the data cells initially programmed to state L2 and L3 and associated with the reference cells initially programmed to state Lr can be due to charge leakage from the floating gates of the cells over time, which reduces the Vt of the memory cells.

The reduced Vt levels of programmed data cells due to such charge leakage can reduce the voltage difference between the Vt of the data cell and one of the read reference voltages R1, R2, and R3 or may place the Vt of a data cell at or below one of the read reference voltages R1, R2, and R3, which can result in a reduction in data retention. For instance, data cells programmed to a particular state, e.g., L0, L1, L2, or L3, can be read as having an incorrect state, e.g., a state other than the particular data state to which the data cell was programmed such that the desired data to be stored by the data cell is not retained over time.

In the embodiment shown in FIG. 3A, the Vt distribution 333-3 is illustrated as being shifted by a greater amount than the Vt distribution 333-2. That is, data cells programmed to state L3 are shown as having experienced a greater amount of charge leakage than data cells programmed to state L2. Also, in the embodiment shown in FIG. 3A, cells programmed to state L1 or L0 are shown as not having experienced any charge leakage. However, embodiments of the present disclosure are not limited to the example shown in FIG. 3A. For example, embodiments of the present disclosure can be used to determine the particular program state to which a data cell was programmed independent of the Vt level shift amounts associated with the number of different program states, e.g., L0, L1, L2, and L3.

In various embodiments of the present disclosure, reference cells which are programmed to a Vt level, e.g., Vvref shown in FIG. 2A, at least as great as an uppermost Vt level to which data cells can be programmed, e.g., Vv3 shown in FIG. 2A, experience a greater Vt level shift, e.g., greater charge leakage, than the data cells. For example, in the embodiment shown in FIG. 3B, the Vt distribution 433 is illustrated as being shifted by a greater amount than the Vt distributions 333-2 and 333-3 shown in FIG. 3A. That is, reference cells programmed to state Lr are shown as having experienced a greater amount of charge leakage over a particular time period than data cells programmed to state L2 or L3 over the same time period.

As memory cells, e.g., data cells and reference cells, experience program and erase cycling, the amount of Vt shift, e.g., charge leakage, can increase. As an example, consider a data cell programmed to Vt distribution 330-3 (L3). In this example, the Vt distribution 333-3 can represent a Vt shift amount of Vt distribution 330-3 of about 30-50 mV. However, after the same data cell has experienced a number of program and/or erase cycles, e.g., 1,000 cycles, and is again programmed to Vt distribution 330-3, the data cell may experience a Vt shift amount of about 50-100 mV, e.g., the Vt distribution 330-3 could be shifted downward by about 50-100 mV. After the same data cell has experienced further program and/or erase cycling, e.g., 10,000 cycles, and is again programmed to Vt distribution 330-3, the data cell may experience a Vt shift amount of about 100-150 mV, e.g., the Vt distribution 330-3 could be shifted downward by about 100-150 mV.

Figure 4:
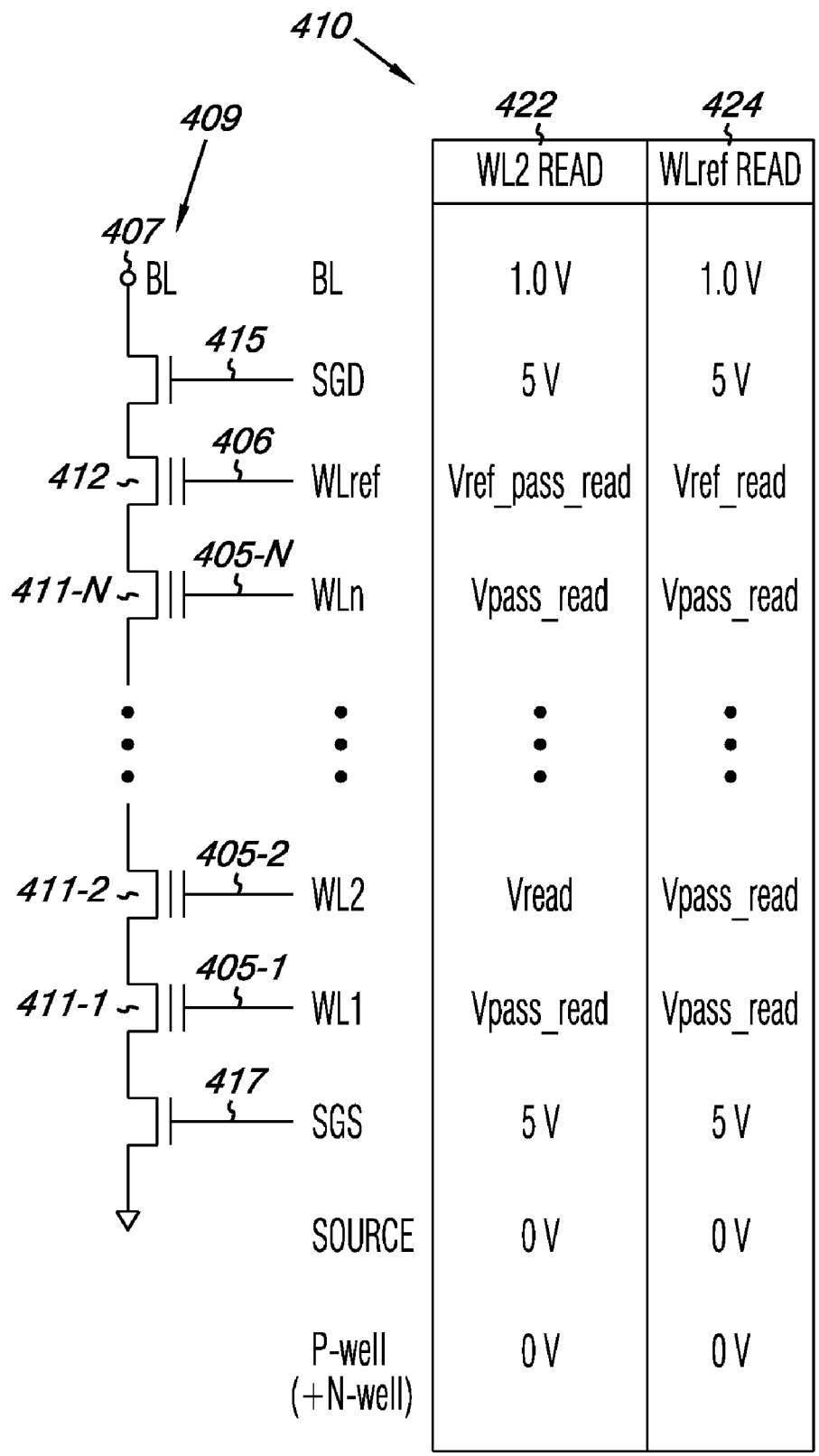
FIG. 4 illustrates a table of operating voltages associated with reading memory cells in a string of memory cells having data memory cells and a reference memory cell in accordance with an embodiment of the present disclosure.

FIG. 4 illustrates a table 410 of operating voltages associated with reading memory cells in a string 409 of memory cells having data memory cells and a reference memory cell in accordance with an embodiment of the present disclosure. The string 409 shown in the embodiment illustrated in FIG. 4 is configured in a similar manner as NAND strings 109-1 to 109-M shown in described in connection with FIG. 1.

In the embodiment of FIG. 4, the string 409 includes a number of data row select lines 405-1 (WL1), 405-2 (WL2), ..., 405-N (WLn) coupled to the control gates of data memory cells 411-1, 411-2, ..., 411-N and a reference row select line 406 (WLref) coupled to the control gate of a reference cell 412. In this embodiment, the reference row select line 406 is adjacent to a drain select line 415, and the data row select line 405-1 is adjacent to a source select line 417. As described above in connection with FIG. 1, in one or more embodiments of the present disclosure, a NAND array of non-volatile memory cells can include any number of strings configured such as string 409 shown in the embodiment illustrated in FIG. 4.

Table 410 illustrates operating voltages, e.g., bias conditions, associated with performing a read operation 422 (WL2 READ) on one or more data cells coupled to a selected data row select line, e.g., data row select line 405-2 (WL2) in this example. As one of ordinary skill in the art will appreciate, a row decoder (not shown) can select a row line coupled to a memory cell to be read, e.g., a data cell and/or a reference cell to be read, based on received address signals.

As shown in table 410, in this embodiment, the read operation 422 performed on data cell 411-2 coupled to selected data row select line 405-2 includes applying a read reference voltage (Vread), e.g., R1, R2, or R3 shown in FIG. 3A, to the selected data row select line 405-2. The read operation 422 includes applying a pass through voltage to unselected row select lines such that unselected cells in string 409 operate in a conducting mode, e.g., the unselected cells in string 409 are turned on and pass current without regard to the Vt level of the unselected cells. Table 410 illustrates that during the read operation 422, the unselected data row select lines, e.g., the unselected ones of data row select lines 405-1 through 405-N, are biased at pass through voltage Vpass_read. During read operation 422, the unselected reference row select line 406 is biased at pass through voltage Vref_pass_read.

As described above in connection with FIG. 2A, in various embodiments, reference cells, e.g., 412, are programmed to a Vt level, e.g., Vvref shown in FIG. 2A, which is at least as great as an uppermost Vt level, e.g., Vv3 shown in FIG. 2A, to which the data cells, e.g., 411-1 to 411-N, can be programmed. In such embodiments, the pass through voltage Vref_pass_read applied to an unselected reference row select line can be higher in magnitude than the pass through voltage Vpass_read applied to an unselected data row select line. As an example, in some embodiments, Vref_pass_read can be about 4.5-5.5V and Vpass_read can be about 6.5-7.5V.

As shown in table 410, in this embodiment, the read operation 422 includes biasing the sense line 407 (BL) at 1.0V, biasing the common source line (SOURCE) at 0V, and biasing a well region (P-well) associated with the string 409 at 0V. In this embodiment, drain select line 415 and the source select line 417 are biased at a voltage, e.g., 5V in this example, sufficient to turn on the respective drain select gate (SGD) and source select gate (SGS) transistors. Under the biasing conditions shown in table 410, voltage and/or current levels on sense line 407 in response to the particular applied read reference voltage Vread, can be sensed by sensing circuitry (not shown) in order to determine a particular state, e.g., state L0, L1, L2, or L3 shown in FIGS. 2A and 3A, of the selected data cell 405-2.

Table 410 also illustrates bias conditions associated with performing a read operation 424 (WLref READ) on one or more reference cells coupled to a selected reference row select line, e.g. reference row select line 406 (WLref) in this example. As shown in table 410, in this embodiment, the read operation 424 performed on reference cell 412 coupled to selected reference row select line 406 includes applying a read reference voltage (Vref_read), e.g., Rref shown in FIG. 3B, to the selected reference row select line 406. As illustrated in table 410, the read operation 424 includes biasing the unselected data row select lines 405-1, 405-2, . . . , 405-N at pass through voltage Vpass_read.

As shown in table 410, in this embodiment, the read operation 424 includes biasing the sense line 407 (BL) at 1.0V, biasing the common source line (SOURCE) at 0V, and biasing the well region (P-well) associated with the string 409 at 0V. In this embodiment, during read operation 424, the drain select line 415 and the source select line 417 are biased at a voltage, e.g., 5V in this example, sufficient to turn on the respective drain select gate (SGD) and source select gate (SGS) transistors. Under the biasing conditions shown in table 410, voltage and/or current levels on sense line 407 in response to the particular applied read reference voltage Vref_read, can be sensed by sensing circuitry (not shown) in order to determine whether the selected reference cell 412 passes or fails the read operation 424.

As described in connection with FIG. 3B, the determination of whether or not the selected reference cell, e.g., 412, passes the read operation, e.g., 424, can be based on whether or not the reference cell conducts current in response to the particular applied read reference voltage, e.g., Vref_read. For instance, the selected reference cell 412 can be considered to pass read operation 424 if sensing of the sense line 407 determines the selected reference cell 412 to be in a non-conducting state, e.g., turned off, in response to the applied read reference voltage Vref_read. The selected reference cell 412 can be considered to fail read operation 424 if sensing of the sense line 407 determines the selected reference cell 412 to be in a conducting state, e.g., turned on, in response to the applied read reference voltage Vref_read. Since whether or not a selected reference cell, e.g., 412, conducts current in response to the read operation biasing conditions depends on the Vt of the selected reference cell, Vt level shifts after the reference cell has been programmed can affect whether the reference cell passes or fails a read operation, e.g., read operation 424.

As described further below in connection with FIGS. 5A through 6C, in one or more embodiments of the present disclosure, the particular read reference voltage level, e.g., Vread, applied to a selected data cell, e.g., 405-2, during a read operation, e.g., 422, is determined based on a read operation, e.g., 424, performed on one or more reference cells, e.g., 412. In various embodiments, the determined particular read reference voltage level depends on the number of reference cells that fail a read operation, e.g., 424. As such, in various embodiments, a read operation is performed on a number of reference cells, e.g., a number of reference cells 412 coupled to a reference row select line 406, prior to performing a read operation on one or more data cells, e.g., one or more data cells 411-1, . . . , 411-N in a string 409.

Embodiments of the present disclosure are not limited to the example voltages shown in table 410. For instance, the voltages applied to the source select line 417 and the drain select line 415 can be greater or less than 5V. Furthermore, embodiments of the present disclosure are not limited to read operations in which the sense line 407 (BL) is biased at 1.0V and in which the common source line (SOURCE) and the well region (P-well) are biased at 0V, e.g., a ground voltage. In some embodiments, the common source line (SOURCE) can be boosted to a positive voltage and a negative read reference voltage, e.g., Vread, can be applied to the selected row select line, e.g., 405-2, during a read operation, e.g., 422. In some embodiments, the voltages applied to the source select line 417, the drain select line 415, the sense line 407 (BL), the common source line (SOURCE), and the well region (P-well) may not be the same values for read operation 422 and 424 as shown in FIG. 4.

Figures 5A, 5B:
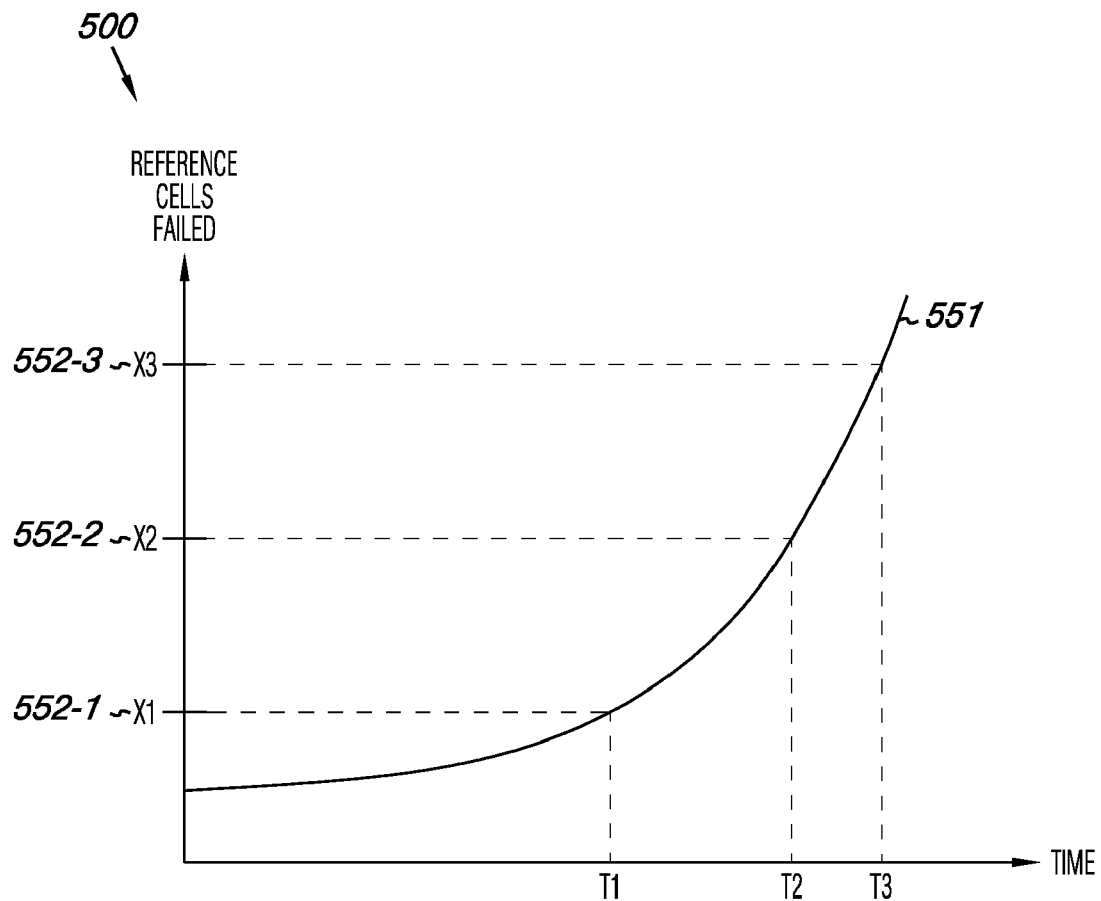
FIG. 5A is a graph illustrating an example of how the number of programmed reference memory cells that fail a read operation in accordance with an embodiment of the present disclosure can vary over time.
FIG. 5B illustrates a table showing read reference voltages used to determine the particular state of a data memory cell based on a read operation performed on a number of reference memory cells in accordance with an embodiment of the present disclosure.

FIG. 5A is a graph 500 illustrating an example of how the number of programmed reference memory cells that fail a read operation in accordance with an embodiment of the present disclosure, e.g., read operation 424 described in FIG. 4, can vary over time. As such, curve 551 shows an example of how the number of reference cells which are programmed to a particular program state, e.g., reference cells programmed to state Lr shown in FIGS. 2A and 3B, and later are determined to fail a read operation in which a particular read reference voltage is used, e.g., read reference voltage Rref shown in FIG. 3B, can increase over time.

As described above, the Vt level of programmed reference cells can decrease over time, which can lead to a downward shifted Vt distribution associated with the programmed reference cells. For instance, as described in connection with FIG. 3B, the Vt levels of reference cells within programmed Vt distribution 340 can experience a downward shift due to charge leakage, electron de-trapping, and/or other mechanisms such that the Vt levels of the reference cells are within downward shifted Vt distribution 343 at the time the reference cells are read, e.g., at the time the reference cells are read via read operation 424 shown in FIG. 4. Since the Vt level of a programmed reference cell decreases over time, a longer elapsed time period between when the reference cell is programmed and when the reference cell is read leads to a greater number of reference cells failing the read operation.

The graph 500 indicates an amount of a number of programmed reference cells determined to have failed a read operation, e.g., read operation 424 shown in FIG. 4, for three different elapsed time periods, e.g., T1, T2, and T3 as shown in FIG. 5A, between when the reference cells were programmed and when the reference cells were read. In one or more embodiments, the number of programmed reference cells is a group of reference cells coupled to a particular row select line, e.g., reference cells 112 coupled to row select line 106 shown in FIG. 1. In such embodiments, the group of reference cells can be programmed and/or read in parallel, e.g., at the same time.

As shown if graph 500, after time T1, a first amount X1 552-1 of the number of reference cells failed the read operation. After time T2, a second amount X2 552-2 of the number of reference cells failed the read operation. After time T3, a third amount X3 552-3 of the number of reference cells failed the read operation. As illustrated in FIG. 5A, the amount X1 is less than the amount X2, and the amount X2 is less than the amount X3. As an example, X1 can be about 100 reference cells, X2 can be about 1,000 reference cells, and X3 can be about 10,000 reference cells.

FIG. 5B illustrates a table 501 showing read reference voltages used to determine the particular state of a data memory cell based on a read operation performed on a number of reference memory cells in accordance with an embodiment of the present disclosure. Table 501 illustrates example sets of read reference voltages used to determine the particular state of one or more data cells based on the different determined amounts X1, X2, and X3 of failed reference cells as shown in FIG. 5A.

In the embodiment illustrated in FIG. 5B, the read reference voltages R1, R2, and R3 shown in table 501 represent initial read reference voltage levels used to determine the particular state of programmed data cells, e.g., the reference voltages 334-1, 334-2, and 334-3 used to determine the particular program state of the number of different program states L0, L1, L2, and L3 as shown in FIG. 3A. As shown in table 501, in one or more embodiments of the present disclosure, one or more of the read reference voltages of the initial set of read reference voltages, e.g., R1, R2, and R3, can be adjusted base on a read operation performed on a number of reference cells.

In the embodiment illustrated in FIG. 5B, the table 501 indicates that if the read operation performed on the number of reference cells results in a determination that the amount of failed reference cells is less than X1, then the initial set of read reference voltages R1, R2, and R3 remain unchanged. The table 501 indicates that if the read operation performed on the number of reference cells results in a determination that the amount of failed reference cells is between X1 and X2, then the initial set of read reference voltages R1, R2, and R3 are adjusted. In this embodiment, if the amount of failed reference cells is between X1 and X2, then the initial read reference voltage R1 remains unchanged, the initial read reference voltage R2 is adjusted by an amount X, e.g., R2−X, and the initial read reference voltage R3 is adjusted by an amount Y, e.g., R3−Y. As an example, X can be about 100 mV and Y can be about 200 mV.

The table 501 also indicates that if the read operation performed on the number of reference cells results in a determination that the amount of failed reference cells is greater than X2, then the initial set of read reference voltages R1, R2, and R3 are adjusted. In this embodiment, if the amount of failed reference cells is greater than X2, then the initial read reference voltage R1 remains unchanged, the initial read reference voltage R2 is adjusted by an amount XX, e.g., R2−XX, and the initial read reference voltage R3 is adjusted by an amount YY, e.g., R3−YY. As an example, XX can be about 200 mV and YY can be about 300 mV.

In various embodiments, those of the initial set of reference voltages, e.g., R1, R2, and R3, which have a greater voltage magnitude, can be adjusted by a greater voltage amount than those of the initial set of reference voltages which have a lower voltage magnitude. For example, in the embodiment of FIG. 5B, the uppermost read reference voltage R3 of the initial set of read reference voltages can be decreased by a greater amount than the other read reference voltages, e.g., R2 and R1, despite the determined amount of failed reference cells being equal. Such embodiments can account for greater Vt level shifts which can be associated with those data cells programmed to higher program Vt levels than the Vt level shifts associated with those data cells programmed to lower program Vt levels. An example of the different Vt level shifts associated with data cells programmed to one of a number of different Vt levels is shown in FIG. 3A and discussed above in connection with FIGS. 2A and 3A.

Embodiments of the present disclosure are not limited to the examples shown in table 501 of FIG. 5B. For instance, in some embodiments, the initial read reference voltage R1 can also be adjusted based on the determined amount of failed reference cells. In some embodiments, the adjusted voltage amount X can be the same as the adjusted voltage amount Y and/or the adjusted voltage amount XX can be the same as the adjusted voltage amount YY. In some embodiments, the determination of whether or not one or more of the initial read reference voltages is adjusted can be based on a single count of failed reference cells. For instance, in some embodiments, one or more of the initial read reference voltages R1, R2, and R3 may be adjusted, e.g., decreased, only if the amount of failed reference cells is X2 or greater, while the initial read reference voltages remain unchanged if the amount of failed reference cells is less than X2.

Figure 6A:
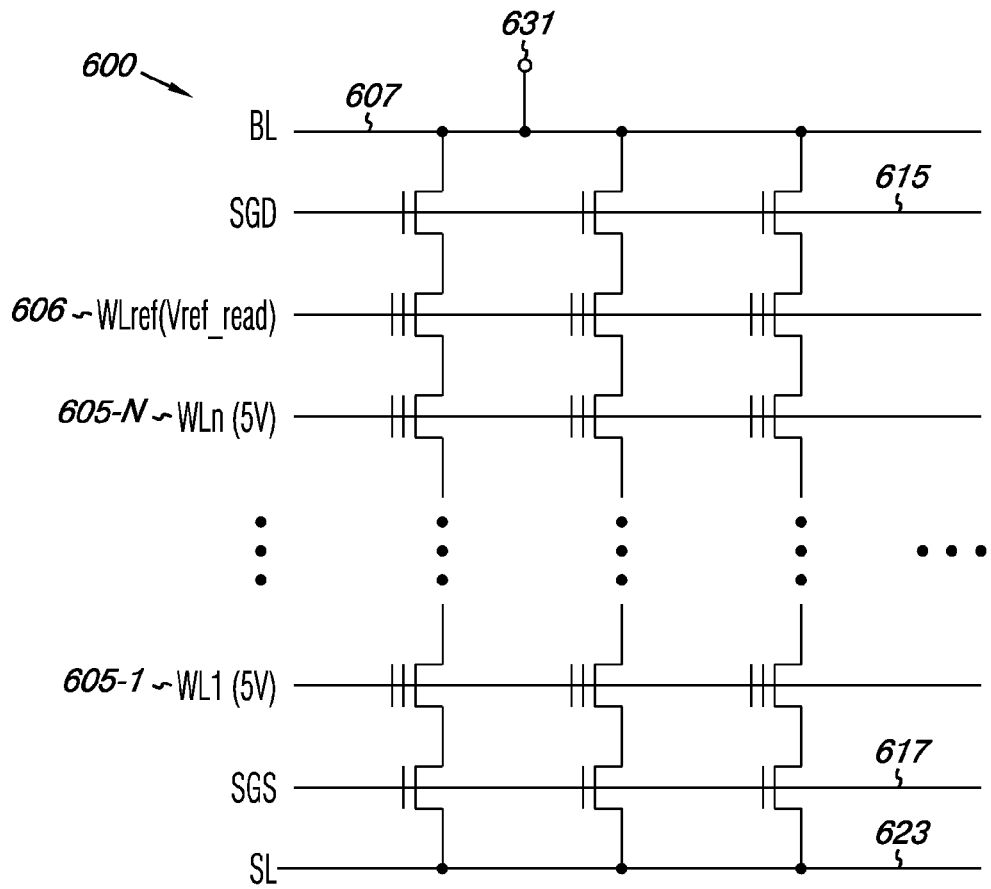
FIG. 6A illustrates a schematic of a portion of a non-volatile memory array in accordance with an embodiment of the present disclosure.

FIG. 6A illustrates a schematic of a portion of a non-volatile memory array in accordance with an embodiment of the present disclosure. The embodiment illustrated in FIG. 6A includes a number of row select lines 605-1 (WL1), . . . , 605-N (WLn) which are coupled to the control gates of a number of data cells, and a row select line 606 (WLref) which is coupled to the control gates of a number of reference cells. In this embodiment, and as described above in connection with FIG. 1, the cells in the strings are coupled source to drain in a NAND configuration between a drain select gate transistor coupled to a drain select line 615 and a source select transistor coupled to a source select line 617. The source select line 617 is adjacent to a common source line 623 and the drain select line 615 is adjacent to a sense line 607 (BL).

In one or more embodiments of the present disclosure, the sense lines associated with the strings of cells can be coupled together, e.g., shorted, during a read operation performed on a number of reference cells, e.g., reference cells coupled to the reference row select line 606 in this example. The read operation can be a read operation such as read operation 424 of FIG. 4. In the embodiment illustrated in FIG. 6A, the sense line 607 is shown as coupling the drain side of each string of cells in the array 600 during a read operation performed on the reference cells coupled to reference row select line 606.

As shown in FIG. 6A, during a read operation performed on the reference cells coupled to row select line 606 of array 600, a read reference voltage (Vref_read) can be applied to the reference row select line 606 while the data row select lines 605-1 through 605-N can be biased at a pass through voltage, e.g., 5V in this example. In such embodiments, a cumulative amount of sense line current associated with the number of reference cells being read can be sensed by sensing circuitry (not shown) during the read operation performed on the reference cells. For instance, node 631 can be sensed in order to determine the cumulative amount of sense line current during a read operation performed on the reference cells.

In embodiments such as that shown in FIG. 6A, in which the sense lines of the strings are coupled together during a reference cell read operation, the sense lines associated with the individual strings can be uncoupled during operations other than reference cell read operations. For example, during a programming operation or a read operation performed on data cells of the array 600, e.g., data cells coupled to data row select lines 605-1 through 605-N, the sense lines associated with the strings may uncoupled such as strings 107-1 through 107-M shown in the embodiment of FIG. 1.

Figure 6B:
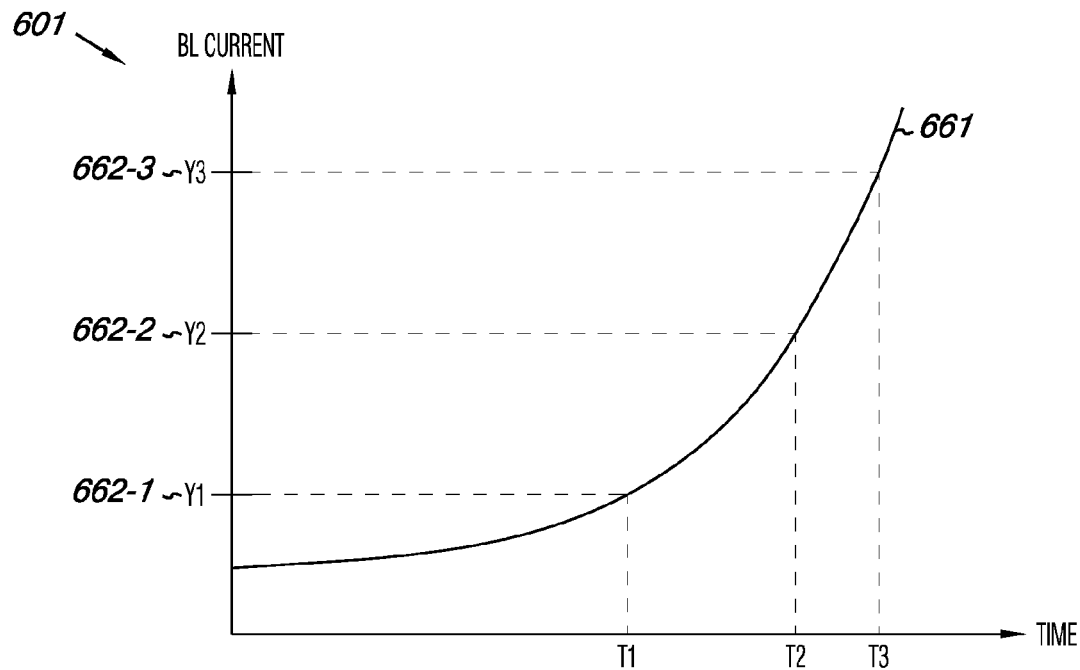
FIG. 6B illustrates a graph showing an example of a cumulative sensed amount of sense line current versus time associated with a read operation performed on a number of reference memory cells in accordance with an embodiment of the present disclosure.

FIG. 6B illustrates a graph 601 showing an example of a cumulative sensed amount of sense line current (BL CURRENT) versus time associated with a read operation performed on a number of reference memory cells, e.g., a read operation during which the sense lines associated with the strings of cells are coupled together such as illustrated in FIG. 6A. As an example, the number of reference cells which are read in parallel, e.g., at the same time, can be about 100-10,000 reference cells. However, embodiments are not so limited, e.g., embodiments can include less than 100 reference cells or more than 10,0000 reference cells.

In FIG. 6B, curve 661 shows an example of how the cumulative amount of sense line current, e.g., the amount of sense line current sensed at node 631 shown in FIG. 6A, associated with a read operation performed on a number of programmed reference cells can increase over time.

As described above, the Vt level of programmed reference cells, e.g., reference cells programmed to state Lr shown in FIGS. 2A and 3B, can decrease over time, which can lead to a downward shifted Vt distribution associated with the programmed reference cells. For instance, as described in connection with FIG. 3B, the Vt levels of reference cells within programmed Vt distribution 340 can experience a downward shift due charge leakage and/or other mechanisms such that the Vt levels of the reference cells are within downward shifted Vt distribution 343 at the time the reference cells are read. Since the Vt level of a programmed reference cell decreases over time, a longer elapsed time period between when the reference cell is programmed and when the reference cell is read leads to a greater number of programmed reference cells that conduct current in response to a particular applied read reference voltage, e.g., Rref shown in FIG. 3B, during a read operation. As such, the sensed cumulative amount of current associated with a number of reference cells during a read operation can be greater when the elapsed time period between when the reference cells are programmed and when they are read is longer.

The graph 601 indicates a cumulative amount of sense line current associated with a read number of programmed reference cells, for three different elapsed time periods, e.g., T1, T2, and T3 as shown in FIG. 6B, between when the reference cells were programmed and when the reference cells were read. In one or more embodiments, the number of programmed reference cells is a group of reference cells coupled to a particular row select line, e.g., reference cells 112 coupled to row select line 106 shown in FIG. 1 or reference cells coupled to row select line 606 (WLref) shown in FIG. 6A.

As shown if graph 601, after time T1, a first amount Y1 662-1 of cumulative sense line current associated with the read number of reference cells is sensed. After time T2, a second amount Y2 662-2 of cumulative sense line current associated with the read number of reference cells is sensed After time T3, a third amount Y3 662-3 of cumulative sense line current associated with the read number of reference cells is sensed As illustrated in FIG. 6B, the amount Y1 is less than the amount Y2, and the amount Y2 is less than the amount Y3.

FIG. 6C illustrates a table 602 showing read reference voltages used to determine the particular state of a data memory cell based on a read operation performed on a reference memory cell in accordance with an embodiment of the present disclosure. Table 602 illustrates example sets of read reference voltages used to determine the particular state of one or more data cells based on the different determined amounts Y1, Y2, and Y3 of cumulative sense line current as shown in FIG. 6B.

In the embodiment illustrated in FIG. 6C, the read reference voltages R1, R2, and R3 shown in table 602 represent initial read reference voltage levels used to determine the particular state of programmed data cells, e.g., the reference voltages 334-1, 334-2, and 334-3 used to determine the particular program state of the number of different program states L0, L1, L2, and L3 as shown in FIG. 3A. As shown in table 602, in one or more embodiments of the present disclosure, one or more of read reference voltages of the initial set of read reference voltages, e.g., R1, R2, and R3, can be adjusted base on a read operation performed on a number of reference cells.

In the embodiment illustrated in FIG. 6C, the table 602 indicates that if the read operation performed on the number of reference cells results in a determination that the sensed amount of cumulative sense line current is less than Y1, then the initial set of read reference voltages R1, R2, and R3 remain unchanged. The table 602 indicates that if the read operation performed on the number of reference cells results in a determination that the sensed amount of cumulative sense line current is between Y1 and Y2, then the initial set of read reference voltages R1, R2, and R3 are adjusted. In this embodiment, if the sensed amount of cumulative sense line current is between Y1 and Y2, then the initial read reference voltage R1 remains unchanged, and the initial read reference voltages R2 and R3 are adjusted by an amount Z, e.g., R2−Z and R3−Z as shown. As an example, Z can be about 50-200 mV.

The table 602 also indicates that if the read operation performed on the number of reference cells results in a determination that the sensed amount of cumulative sense line current is greater than Y2, then the initial set of read reference voltages R1, R2, and R3 are adjusted. In this embodiment, if the sensed amount of cumulative sense line current is greater than Y2, then the initial read reference voltage R1 remains unchanged, the initial read reference voltage R2 is adjusted by an amount ZZ, e.g., R2−ZZ, and the initial read reference voltage R3 is adjusted by an amount ZZ, e.g., R3−ZZ. As an example, ZZ can be about 200 mV-400 mV.

Embodiments of the present disclosure are not limited to the examples shown in table 602 of FIG. 6C. For instance, in some embodiments, the initial read reference voltage R1 can also be adjusted based on the determined amount of sense line current. In some embodiments, the initial read reference voltages R1, R2, and R3 can each be adjusted by different amounts.

FIG. 7 illustrates a schematic of a portion of a non-volatile memory array in accordance with an embodiment of the present disclosure. The embodiment illustrated in FIG. 7 illustrates a single string 709 in a NAND configuration, e.g., the memory cells are coupled in series source to drain. An array of memory cells can include a number of strings 709, e.g., array 100 shown in FIG. 1 includes a number of strings 109-1, . . . , 109-M.

In this embodiment, the string 709 includes data cells coupled to a number of data row select lines 705-1 (WL1), 705-2 (WL2), . . . , 705-N (WLN) such that data row select line 705-N is located at an end of string 709 adjacent to drain select line 715. The string 709 includes a reference cell coupled to reference row select line 706 (WLref) which is located at an end of string 709 adjacent to a source select line 719.

The data cells and reference cell of string 709 can be operated in accordance with embodiments described herein above. For instance, one or more data cells of the string 709 can be programmed to one of a number of different threshold voltage (Vt) levels, each level corresponding to a program state, as described in FIGS. 2 and 3A. Also, the reference cell of one or more strings 709 can be programmed to a Vt level at least as great as an uppermost Vt level of the number of different Vt levels to which the data cells are programmed, as shown in FIGS. 2 and 3B. A number of read reference voltages used to determine the particular state of one or more of the data cells of string 709 can then be determined based on a read operation performed on the reference cell of one or more strings 709. During a read operation, sensing circuitry (not shown) can detect current and/or voltage levels on sense line 707 based on whether current flows through string 709, e.g., between common source line (SL) 723 and sense line 707, in response to a particular applied read reference voltage and Vt level of the cell, in order to determine the particular state of the cell.

FIG. 8 illustrates a schematic of a portion of a non-volatile memory array in accordance with an embodiment of the present disclosure. The embodiment illustrated in FIG. 8 illustrates a single string 809 in a NAND configuration, e.g., the memory cells are coupled in series source to drain. An array of memory cells can include a number of strings 809, e.g., array 100 shown in FIG. 1 includes a number of strings 109-1, ..., 109-M.

In this embodiment, the string 809 includes data cells coupled to a number of data row select lines 805-1 (WL1), 805-2 (WL2), ..., 805-N (WLN). The string 809 includes a reference cell coupled to reference row select line 806-1 (WLref-1) and a reference cell couple to reference row select line 806-2 (WLref-2). In this embodiment, the reference row select lines 806-1 and 806-2 are located at opposite ends of string 809, e.g., row select line 806-1 is adjacent to source select line 819 and row select line 806-2 is adjacent to drain select line 815, such that the data row select lines 805-1 to 805-N are not located at the ends of string 809.

The data cells and reference cell of string 809 can be operated in accordance with embodiments described herein above. For instance, one or more data cells of the string 809 can be programmed to one of a number of different threshold voltage (Vt) levels, each level corresponding to a program state, as described in FIGS. 2 and 3A. Also, the reference cells of one or more strings 809 can be programmed to a Vt level at least as great as an uppermost Vt level of the number of different Vt levels to which the data cells are programmed, as shown in FIGS. 2 and 3B. A number of read reference voltages used to determine the particular state of one or more of the data cells of string 809 can then be determined based on a read operation performed on the reference cells of one or more strings 809. During a read operation, sensing circuitry (not shown) can detect current and/or voltage levels on sense line 807 based on whether current flows through string 809, e.g., between common source line (SL) 823 and sense line 807, in response to a particular applied read reference voltage and Vt level of the cell, in order to determine the particular state of the cell.

FIGS. 9A and 9B illustrate flow diagrams for operating an array of memory cells according to an embodiment of the present disclosure. FIG. 9A illustrates a programming method in accordance with an embodiment of the present disclosure and FIG. 9B illustrates a reading method in accordance with an embodiment of the present disclosure. The array can be a NAND array and can include non-volatile multilevel data memory cells and reference memory cells. The data cells and reference cells can be arranged in a number of blocks of memory cells, e.g., block 100 shown in FIG. 1. In one or more embodiments, the blocks in the array can include a row of reference cells. In such embodiments, the reference cells of the row of reference cells can be located at an end of the strings of the block, e.g., on the drain side end or on the source side end of the strings of the block. In various embodiments, the array can include more than one row of reference cells. In one or more embodiments, each block of cells in the array can include one or more rows of reference cells. For example, in some embodiments, the array can include a row of reference cells on the drain side end and on the source side end of the strings of the array.

At block 910, programming embodiment illustrated in FIG. 9A includes programming a number of data memory cells coupled to a selected row select line to one of a number of different threshold voltage (Vt) levels, each different Vt level corresponding to a different program state, e.g., program state L0, L1, L2, and L3 shown in FIG. 2A. At block 920, the method includes programming a number of reference cells to a particular Vt level. For instance, in one or more embodiments, one or more rows of reference cells can be programmed to a Vt level at least as great as an uppermost Vt level of the number of different Vt levels to which the data cells could have been programmed, e.g., the reference cells can be programmed to a program verify voltage such as Vvref 242 shown in FIG. 2A.

In various embodiments, a number of reference cells coupled to a selected reference row select line can be programmed in parallel. In one or more embodiments, the method includes programming the data cells prior to programming the reference cells. As described in FIG. 2B, in some embodiments, the initial program pulse applied to the control gate of the data cells is lesser in magnitude than the initial program pulse used to program the reference cells. Also, in various embodiments, the voltage step, e.g., Vpgm_step shown in FIG. 2B, between programming pulses is different for data cells and reference cells. In such embodiments, the voltage step between programming pulses can be greater for reference cells than for data cells in order to speed programming time associated with programming the reference cells while maintaining narrow Vt distributions associated with the data cells.

At block 930 of the read embodiment illustrated in FIG. 9B, the method includes selecting a block of memory cells in the array to be read, e.g., a block of memory cells which has been programmed in accordance with an embodiments described herein. At block 940, the method includes performing a read operation on the number of reference cells in the selected block, e.g., a group of reference cells coupled to a reference row select line. In one or more embodiments, the number of reference cells is an entire row of reference cells. In one or more embodiments, performing the read operation on the number of reference cells includes sensing the sense lines corresponding to the reference cells to determine an amount of the number of reference cells which conduct current upon application of a particular read reference voltage to a row select line to which the number of reference cells are coupled. In one or more embodiments, performing the read operation on the number of reference cells includes applying a particular read reference voltage to a row select line to which the number of reference cells are coupled, and sensing a cumulative amount of sense line current associated with the number of reference cells. As shown in FIG. 6A, in one or more embodiments, the method includes coupling sense lines associated with the number of reference cells together in order to sense the cumulative amount of sense line current.

At block 950, the method includes determining a number of read reference voltages to be used to determine the particular program states of the data memory cells in the selected block based on the read operation 940 performed on the reference cells in the selected block. In one or more embodiments, the method can include adjusting at least one read reference voltage of an initial set of read reference voltages, e.g., R1, R2, and R3 shown in FIG. 3A, from an initial voltage level. In one or more embodiments, the adjusted values for read reference voltages are determined on a block by block basis. For example, the determined read reference voltages for the current block being read, i.e., the selected block 930, can be different for other blocks.

In embodiments in which the read operation performed on the number of reference cells includes sensing the sense lines corresponding to the reference cells to determine an amount of the number of reference cells which conduct current upon application of a particular read reference voltage to a row select line to which the number of reference cells are coupled, the method can include adjusting the at least one of the number of initial read reference voltages based on the determined amount of the number of reference cells. In some embodiments, the method includes adjusting at least two of the number of initial read reference voltages by different amounts depending on the determined amount of the number of reference cells.

In embodiments in which the read operation performed on the number of reference cells includes applying a particular read reference voltage to a row select line to which the number of reference cells are coupled, and sensing a cumulative amount of sense line current associated with the number of reference cells, the method can include adjusting the at least one of the number of initial read reference voltages based on the cumulative amount of sense line current. In some embodiments, the method includes adjusting at least two of the number of initial read reference voltages, associated with reading data cells, by different amounts depending on the determined cumulative amount of sense line current.

At block 960, the method includes performing a read operation on the data memory cells in the selected block using the determined read reference voltages, e.g., the reference voltages determined at block 950. For instance, in embodiments in which the read reference voltages are adjusted based on the read operation performed on the reference cells, then the adjusted read reference voltages can be used when performing the read operation on the data cells in the selected block.

Figure 10:
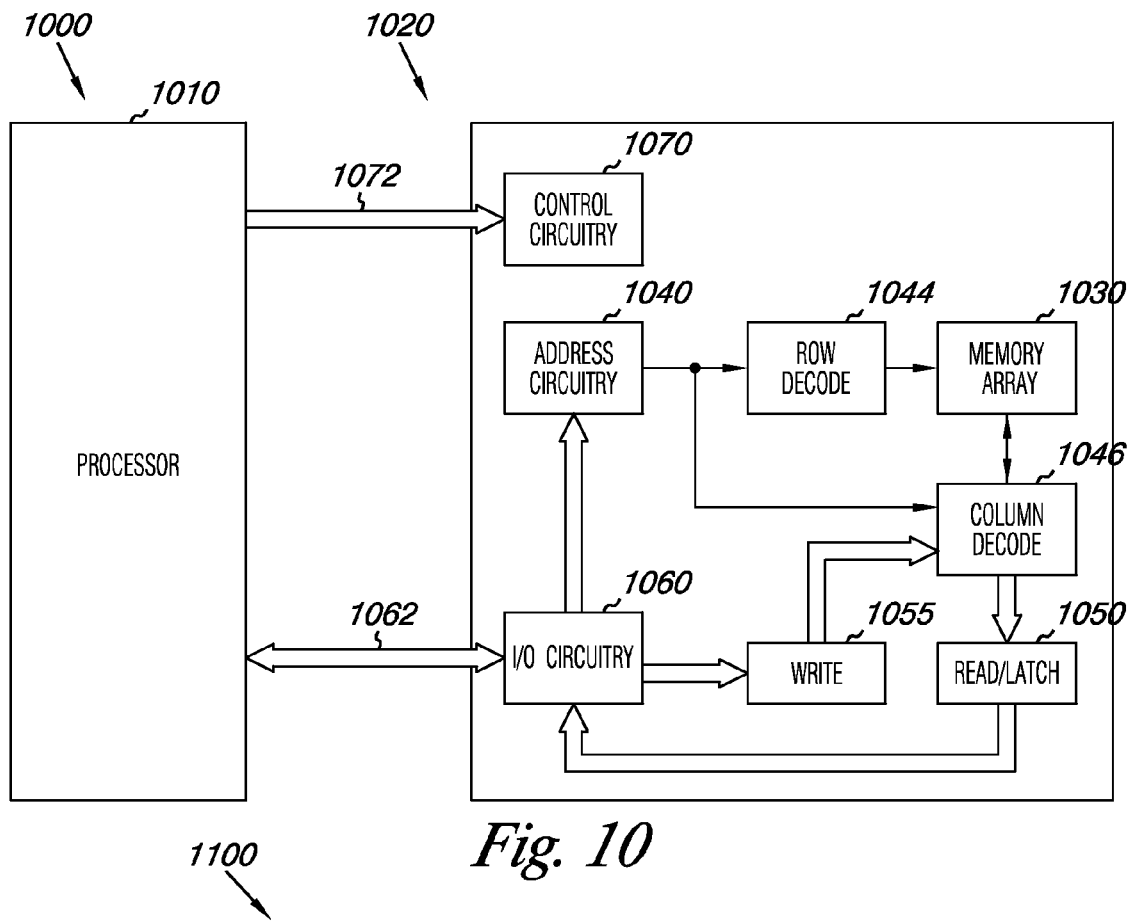
FIG. 10 is a functional block diagram of an electronic memory system having at least one memory device in accordance with an embodiment of the present disclosure.

FIG. 10 is a functional block diagram of an electronic memory system 1000 having at least one memory device 1020 in accordance with an embodiment of the present disclosure. Memory system 1000 includes a processor 1010 coupled to a non-volatile memory device 1020 that includes a memory array 1030 of multilevel non-volatile cells. The memory system 1000 can include separate integrated circuits or both the processor 1010 and the memory device 1020 can be on the same integrated circuit. The processor 1010 can be a microprocessor or some other type of controlling circuitry such as an application-specific integrated circuit (ASIC).

The memory device 1020 includes an array 1030 of non-volatile memory cells, which can be floating gate flash memory cells with a NAND architecture. The control gates of each row of memory cells are coupled with a select line, while the drain regions of the memory cells are coupled to sense lines. The source regions of the memory cells are coupled to source lines, as the same has been illustrated in FIG. 1. As will be appreciated by those of ordinary skill in the art, the manner of connection of the memory cells to the sense lines and source lines depends on whether the array is a NAND architecture, a NOR architecture, and AND architecture, or some other memory array architecture.

The embodiment of FIG. 10 includes address circuitry 1040 to latch address signals provided over I/O connections 1062 through I/O circuitry 1060. Address signals are received and decoded by a row decoder 1044 and a column decoder 1046 to access the memory array 1030. In light of the present disclosure, it will be appreciated by those skilled in the art that the number of address input connections depends on the density and architecture of the memory array 1030 and that the number of addresses increases with both increased numbers of memory cells and increased numbers of memory blocks and arrays.

The memory array 1030 of non-volatile memory cells can include data memory cells and reference memory cells according to embodiments described herein. The memory device 1020 reads data in the memory array 1030 by sensing voltage and/or current changes in the memory array columns using sense/buffer circuitry that in this embodiment can be read/latch circuitry 1050. The read/latch circuitry 1050 can read and latch a page or row of data from the memory array 1030. I/O circuitry 1060 is included for bi-directional data communication over the I/O connections 1062 with the processor 1010. Write circuitry 1055 is included to write data to the memory array 1030.

Control circuitry 1070 decodes signals provided by control connections 1072 from the processor 1010. These signals can include chip signals, write enable signals, and address latch signals that are used to control the operations on the memory array 1030, including data read, data write, and data erase operations. In various embodiments, the control circuitry 1070 is responsible for executing instructions from the processor 1010 to perform the operating embodiments of the present disclosure. The control circuitry 1070 can be a state machine, a sequencer, or some other type of controller. It will be appreciated by those skilled in the art that additional circuitry and control signals can be provided, and that the memory device detail of FIG. 10 has been reduced to facilitate ease of illustration.

Figure 11:
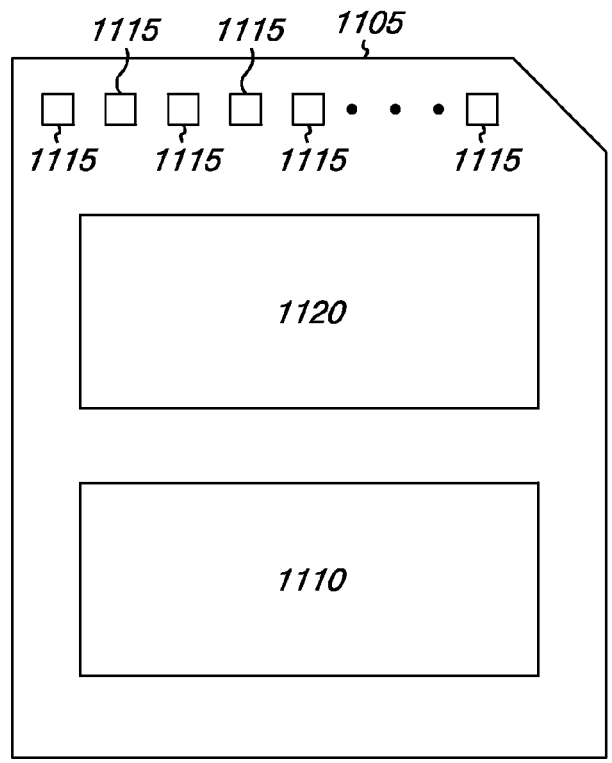
FIG. 11 is a functional block diagram of a memory module having at least one memory device in accordance with an embodiment of the present disclosure.

FIG. 11 is a functional block diagram of a memory module 1100 having at least one memory device in accordance with an embodiment of the present disclosure. Memory module 1100 is illustrated as a memory card, although the concepts discussed with reference to memory module 1100 are applicable to other types of removable or portable memory (e.g., USB flash drives) and are intended to be within the scope of "memory module" as used herein. In addition, although one example form factor is depicted in FIG. 11, these concepts are applicable to other form factors as well.

In some embodiments, memory module 1100 will include a housing 1105 (as depicted) to enclose one or more memory devices 1110, though such a housing is not essential to all devices or device applications. At least one memory device 1110 includes an array of non-volatile multilevel memory cells that includes data cells and reference cells that can be operated, e.g., programmed and/or read, according to embodiments described herein. Where present, the housing 1105 includes one or more contacts 1115 for communication with a host device. Examples of host devices include digital cameras, digital recording and playback devices, PDAs, personal computers, memory card readers, interface hubs and the like. For some embodiments, the contacts 1115 are in the form of a standardized interface. For example, with a USB flash drive, the contacts 1115 might be in the form of a USB Type-A male connector. For some embodiments, the contacts 1115 are in the form of a semi-proprietary interface, such as might be found on CompactFlash™ memory cards licensed by SanDisk Corporation, Memory Stick™ memory cards licensed by Sony Corporation, SD Secure Digital™ memory cards licensed by Toshiba Corporation and the like. In general, however, contacts 1115 provide an interface for passing control, address and/or data signals between the memory module 1100 and a host having compatible receptors for the contacts 1115.

The memory module 1100 may optionally include additional circuitry 1120, which may be one or more integrated circuits and/or discrete components. For some embodiments, the additional circuitry 1120 may include control circuitry, such as a memory controller, for controlling access across multiple memory devices 1110 and/or for providing a translation layer between an external host and a memory device 1110. For example, there may not be a one-to-one correspondence between the number of contacts 1115 and a number of 1110 connections to the one or more memory devices 1110. Thus, a memory controller could selectively couple an I/O connection (not shown in FIG. 11) of a memory device 1110 to receive the appropriate signal at the appropriate I/O connection at the appropriate time or to provide the appropriate signal at the appropriate contact 1115 at the appropriate time. Similarly, the communication protocol between a host and the memory module 1100 may be different than what is required for access of a memory device 1110. A memory controller could then translate the command sequences received from a host into the appropriate command sequences to achieve the desired access to the memory device 1110. Such translation may further include changes in signal voltage levels in addition to command sequences.

The additional circuitry 1120 may further include functionality unrelated to control of a memory device 1110 such as logic functions as might be performed by an ASIC. Also, the additional circuitry 1120 may include circuitry to restrict read or write access to the memory module 1100, such as password protection, biometrics or the like. The additional circuitry 1120 may include circuitry to indicate a status of the memory module 1100. For example, the additional circuitry 1120 may include functionality to determine whether power is being supplied to the memory module 1100 and whether the memory module 1100 is currently being accessed, and to display an indication of its status, such as a solid light while powered and a flashing light while being accessed. The additional circuitry 1120 may further include passive devices, such as decoupling capacitors to help regulate power requirements within the memory module 1100.

CONCLUSION

Methods, devices, modules, and systems for operating non-volatile multilevel memory cells have been shown. One or more method embodiment includes programming a memory cell to one of a number of different threshold voltage (Vt) levels, each level corresponding to a program state. The method includes programming a reference cell to a Vt level at least as great as an uppermost Vt level of the number of different Vt levels, performing a read operation on the reference cell, and determining a number of read reference voltages used to determine a particular program state of the memory cell based on the read operation performed on the reference cell.

In one or more embodiments, determining the number of read reference voltages can include adjusting at least one read reference voltage of an initial set of predetermined read reference voltages from an initial voltage level. As such, one or more of the initial set of read reference voltages used to determine the particular state of one or more data cells can be based on a read operation performed on one or more reference cells.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for operating a memory device, comprising:
   programming a number of memory cells to one of a number of different threshold voltage (Vt) levels, each level corresponding to a program state;
   programming a number of reference cells to a Vt level at least as great as an uppermost Vt level of the number of different Vt levels;
   performing a read operation on the number of reference cells and determining an amount of the number of reference cells which conduct current upon application of a particular read reference voltage to a row select line to which the number of reference cells are coupled; and
   determining a number of read reference voltages used to determine a particular program state of the memory cell based on the read operation performed on the reference cell; and
   adjusting at least two of the number of read reference voltages based on the determined amount of the number of reference cells which conduct current upon application of the particular read reference voltage.

2. The method of claim 1, wherein the method includes programming the number of memory cells by applying an initial program pulse to a control gate of the number of memory cells which is lesser in magnitude than an initial program pulse used to program the number of reference cells.

3. The method of claim 1, wherein the method includes programming the number of memory cells to the particular program state prior to programming the number of reference cells.

4. The method of claim 1, wherein the method includes performing a read operation on the number of memory cells coupled to the row select line, the read operation including:
   applying a first pass through voltage to the row select line to which the number of reference cells are coupled;
   applying one of the adjusted read reference voltages to the row select line; and
   applying a second pass through voltage, lower than the first pass through voltage, to at least one unselected row select line of the array.

5. A method for operating a memory system, comprising:
   programming a number of memory cells coupled to a selected row select line in a NAND array to one of a number of different threshold voltage (Vt) levels, each different Vt level corresponding to a different program state;

programming a number of reference cells to a particular Vt level;

performing a read operation on the number of reference cells;

adjusting at least one of a number of initial read reference voltages used to determine a particular program state of the number of memory cells based on the read operation performed on the number of reference cells; and performing a read operation on the number of memory cells coupled to the selected row select line, the read operation including:

applying a first pass through voltage to a row select line to which the number of reference cells are coupled;

applying one of the adjusted read reference voltages to the selected row select line; and applying a second pass through voltage, lower than the first pass through voltage, to at least one unselected row select line of the array.

6. The method of claim 5, wherein:

each of the number of reference cells is coupled to one of a number of sense lines; and performing the read operation on the number of reference cells includes sensing the number of sense lines to determine an amount of the number of reference cells which conduct current upon application of a particular read reference voltage to a row select line to which the number of reference cells are coupled.

7. The method of claim 6, wherein the method includes adjusting the at least one of the number of initial read reference voltages based on the determined amount of the number of reference cells.

8. The method of claim 7, wherein the method includes adjusting at least two of the number of initial read reference voltages by different amounts depending on the determined amount of the number of reference cells.

9. The method of claim 5, wherein performing the read operation on the number of reference cells includes:

applying a particular read reference voltage to a row select line to which the number of reference cells are coupled; and sensing a cumulative amount of sense line current associated with the number of reference cells.

10. The method of claim 9, wherein the method includes adjusting the at least one of the number of initial read reference voltages based on the cumulative amount of sense line current.

11. The method of claim 10, wherein the method includes adjusting at least two of the number of initial read reference voltages by different amounts depending on the determined cumulative amount of sense line current.

12. The method of claim 9, wherein the method includes coupling sense lines associated with the number of reference cells together in order to sense the cumulative amount of sense line current.

13. A memory device, comprising:

an array of memory cells arranged in rows coupled by row select lines and columns coupled by sense lines, the array including a row having a number of reference cells; and control circuitry coupled to the array of memory cells and configured to:

program data memory cells coupled to a selected row to one of a number of different threshold voltage (Vt) levels, each different Vt level corresponding to a different program state;

program the number of reference cells to a particular Vt level;

perform a read operation on the number of reference cells by sensing a cumulative amount of sense line current associated with the number of reference cells based on a particular read reference voltage applied to the row select line to which the number of reference cells are coupled; and adjust at least two of a number of initial read reference voltages used to determine a particular program state of the data memory cells coupled to the selected row by different amounts based on the cumulative amount of sense line current.

14. The device of claim 13, wherein the control circuitry is configured to determine an amount of the number of reference cells which conduct current upon application of a particular read reference voltage to the row select line to which the number of reference cells are coupled.

15. The device of claim 14, wherein the control circuitry is configured to adjust at least two of the number of initial read reference voltages based on the determined amount of the number of reference cells which conduct current upon application of the particular read reference voltage.

16. The device of claim 15, wherein the control circuitry is configured to adjust the at least two of the number of initial read reference voltages by different amounts depending on the determined amount of the number of reference cells.

17. The device of claim 13, wherein the row having the number of reference cells is adjacent to a select gate of the array.

18. The device of claim 17, wherein the number of reference cells are programmed after the memory cells coupled to the selected row have been programmed.

19. The device of claim 17, wherein the control circuitry is configured to perform a read operation on the memory cells coupled to the selected row select line by:

applying a first pass through voltage to a row select line to which the number of reference cells are coupled;

applying one of the at least one of the adjusted read reference voltages to the selected row select line; and applying a second pass through voltage, lower than the first pass through voltage, to at least one unselected row select line of the array.

20. The device of claim 13, wherein the array includes a number of blocks of memory cells and wherein the control circuitry is configured to adjust the at least one of the number of initial read reverence voltages on a block by block basis.

21. The device of claim 13, wherein the array includes at least two rows having a number of reference cells.

22. The device of claim 13, wherein the particular Vt level to which the number of reference cells are programmed is at least as great as an uppermost Vt level of the number of different Vt levels to which the number of data memory cells are programmed.

* * * * *

UNITED STATES PATENT AND TRADEMARK OFFICE
CERTIFICATE OF CORRECTION

PATENT NO. : 7,675,772 B2
APPLICATION NO. : 11/924793
DATED : March 9, 2010
INVENTOR(S) : Akira Goda et al.

Page 1 of 1

It is certified that error appears in the above-identified patent and that said Letters Patent is hereby corrected as shown below:

In column 24, line 53, in Claim 20, delete "reverence" and insert -- reference --, therefor.

Signed and Sealed this

Twenty-fifth Day of May, 2010

David J. Kappos
*Director of the United States Patent and Trademark Office*